(12) United States Patent
Akin et al.

(10) Patent No.: US 6,347,732 B1
(45) Date of Patent: Feb. 19, 2002

(54) CIRCUIT BOARD COMPONENT RETENTION

(75) Inventors: James Sherill Akin, Round Rock; Thomas Alan Schiesser, Austin; John Andrew Shriver, III, Cedar Park, all of TX (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 09/538,460

(22) Filed: Mar. 30, 2000

Related U.S. Application Data

(62) Division of application No. 09/235,882, filed on Jan. 22, 1999, now Pat. No. 6,095,403.

(51) Int. Cl.$^7$ .................. B23K 1/00; F27D 11/00; F27B 5/16
(52) U.S. Cl. .................. 228/9; 228/42; 228/46; 219/388; 219/391; 432/48; 432/200
(58) Field of Search .................. 228/219, 42, 8, 228/9, 10, 46, 102, 103; 432/36, 48, 120, 200, 201, 202, 233, 247, 249; 219/388, 391, 395, 400

(56) References Cited

U.S. PATENT DOCUMENTS

| | | | |
|---|---|---|---|
| 5,144,535 A | 9/1992 | Megens et al. | 361/400 |
| 5,192,582 A | 3/1993 | Liedke et al. | 228/206 |
| 5,678,304 A | 10/1997 | Soper | 29/840 |
| 5,680,985 A | 10/1997 | Wentworth | 228/246 |
| 5,703,405 A | 12/1997 | Zeber | 257/777 |
| 5,770,835 A | 6/1998 | Sakuyama et al. | 219/388 |
| 5,785,233 A | 7/1998 | Nutter et al. | 228/46 |
| 5,846,852 A | 12/1998 | Limper-Brenner et al. | 438/118 |
| 5,993,500 A | 11/1999 | Bailey et al. | 55/385.6 |
| 6,010,061 A | 1/2000 | Howell | 228/180.21 |
| 6,123,247 A | * 9/2000 | Shibo et al. | |
| 6,131,793 A | * 10/2000 | Howell | |
| 2001/0002066 A1 | * 5/2001 | Mita et al. | |

* cited by examiner

*Primary Examiner*—Tom Dunn
*Assistant Examiner*—Kiley Stoner
(74) *Attorney, Agent, or Firm*—Robert V. Wilder

(57) ABSTRACT

A method and implementing system is provided in which a gas, such as oxygen, is injected on to area of a circuit board to which an electronic component is being mounted. The injected gas causes a formation of a coating or surface alloy layer such as tin-oxide, on the solder joint. The coating causes the solder bead or joint to have a higher surface tension and a higher reflow temperature. In an exemplary double-sided double-pass assembly operation, circuit boards pass through a soldering oven on a first pass to attach components to a first side, and then the board is inverted and passed through the oven on a second pass while components are mounted on the opposite side of the board. During the second pass, a gas injection device is aimed at the component-to-board connection points on the inverted side of the board which were soldered on the first pass. The gas is injected at the point in the soldering reflow oven at which the temperature begins to exceed the solder reflow temperature. The gas injection is effective to cause the formation of a surface layer on the solder bead thereby increasing the surface tension between the circuit board and the mounted component during the second pass reflow.

11 Claims, 2 Drawing Sheets

CIRCUIT BOARD COMPONENT RETENTION

This application is a divisional of Ser. No. 09/235,882 filed Jan. 22, 1999 now U.S. Pat. No. 6,095,403.

FIELD OF THE INVENTION

The present invention relates generally to circuit board assembly and more particularly to an improved method and apparatus for mounting electronic components to printed circuit boards.

BACKGROUND OF THE INVENTION

Most electronic devices today include a large number of electronic components or integrated circuits (ICs) which are mounted to circuit boards which are arranged within the device. The components are attached to the boards and each of the components has a large number of electrical leads which must be individually connected to specific electrical points on the circuit board. The components are held to the board with adhesive materials and also, at least in part, by the soldered electrical connections.

In order to increase the number of components than can be mounted within a given device volume and therefore decrease the size of, or miniaturize, many electronic devices, circuit boards are being assembled having components mounted on both sides of a circuit board instead of having components mounted on only one side of the board. During the assembly process, circuit board components are mounted on a first side of the circuit board during a first pass-through of a soldering oven during which a mixture of solder beads and flux between the components and the circuit board are heated to a point at which the solder begins to flow as a liquid. As the circuit board completes the oven process, the solder cools and hardens thereby forming a solid electrical and mechanical connection between the component connection points and the corresponding connection points on the circuit board. The components are mounted on the second side of the circuit board by inverting the board and running a second pass of the board through the soldering oven during which components are mounted on the second side of the circuit board.

During the second pass through the solder oven, the components which were mounted during the first pass are on the bottom side of the board and are subject to the force of gravity which asserts a force tending to pull the components downwardly and away from the board. As the first side components pass the "reflow" area of the solder oven, the soldered connections made during the first pass change state from solid to liquid or "reflow" and reduce the surface tension which holds the components to the circuit boards. When the ratio of the mass of the components to the surface tension holding the components to the boards exceeds a certain value, the first pass soldered connections will become weak and there is a tendency for the components mounted during the first pass to fall off the underside of the board and the board will have to be reworked.

The industry's current emphasis on miniaturization and environmentally-friendly soldering (inert gas blanket, no-clean flux and low solid flux) increases the component retention problem because the trends are to reduce the surface area and the surface tension of the solder. While some new techniques aid the soldering process during a first pass, such techniques also increase the fall-off rate for components going through a second pass on the underside of a circuit board.

Thus, there is a need for an improved methodology and implementing system for mounting electronic components on printed circuit boards and controlling solder reflow.

SUMMARY OF THE INVENTION

A method and implementing system is provided in which a gas is injected on to an area of a circuit board to which an electronic component is being mounted. The injected gas causes a formation of a coating or surface alloy layer on the solder bead. The coating causes the solder bead to have a higher surface tension and a higher reflow temperature. In an exemplary double-sided double-pass assembly operation, circuit boards pass through a soldering oven on a first pass to attach components to a first side, and then the board is inverted and passed through the oven on a second pass while components are mounted on the opposite side of the board. During the second pass, a gas injection device is aimed at the component-to-board connection points on the inverted side of the board which were soldered on the first pass. The gas is injected at the point in the soldering reflow oven at which the temperature begins to exceed the solder reflow temperature. The gas injection is effective to cause the formation of a surface layer on the solder bead thereby increasing the surface tension of the molten solder between the circuit board and the mounted component during the second pass reflow. The temperature of the injected gas may also be varied to achieve desirable results.

BRIEF DESCRIPTION OF THE DRAWINGS

A better understanding of the present invention can be obtained when the following detailed description of a preferred embodiment is considered in conjunction with the following drawings, in which.

DETAILED DESCRIPTION

The present invention is designed to alter the solder surface tension and surface temperature characteristic of solder joints formed on a first pass through of a solder oven, during a second pass reflow. In an exemplary embodiment, the task is accomplished by injecting a micro-thin layer of gas under the assemblies or boards on the first pass side at the same time that the second pass side of the board reaches reflow temperature. The gas mixture will cause a chemical reaction with the solder surface of the first pass joints. That reaction will result in a solder surface alloy layer with desired characteristics including higher surface temperature and higher reflow temperature for the solder joint. One example of a gas that will cause this result is oxygen, which, when present with the solder at reflow temperature, will cause tin-oxides to form on the surface of the solder joint. The desired type of reaction can be achieved by placing a pneumatic knife under the conveyor of a convection reflow oven at the point where the assemblies first reach reflow temperatures. The pressurized gas will be forced through the knife forming a micro-layer of gas over the previously formed solder joints. The knife design is set to cover a small part of the assemblies and to limit the volume of gas to prevent degradation of the oven nitrogen atmosphere blanket on the top side of the assemblies during the second pass.

Current industry practices for component retention during the soldering process include gluing the component to the substrate in a previous operation, providing a product-specific heat shield mechanism over the component during reflow, and moving the part to a hand-soldering operation after reflow. The present invention does not require the fabrication of product-specific heat shields or the creation of secondary operations to support component retention. The disclosed methodology adapts to a mass reflow process and eliminates added product manufacturing cost which would otherwise be needed in order to insure component retention.

Figure 1:
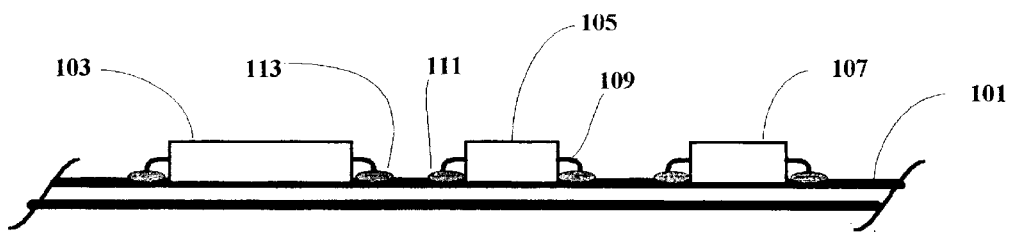
FIG. 1 is an illustration showing electronic components mounted on one side of a circuit board.

In FIG. 1 there is shown a circuit board 101 upon which there are mounted a plurality of electronic components or integrated circuits (ICs) including components 103 105 and 107. Each of the components 103, 105 and 107 include connecting leads such as connector 109, which are connected to the electronic component and arranged for connection to corresponding connection points on the circuit board 101 by means of solder "balls" or "beads" such as beads 111 and 113. The board 101 of FIG. 1 is shown as it is oriented during a first pass through of a soldering oven during which time the components such as 103, 105 and 107, are attached to the first side or top side of the circuit board 101.

Figure 2:
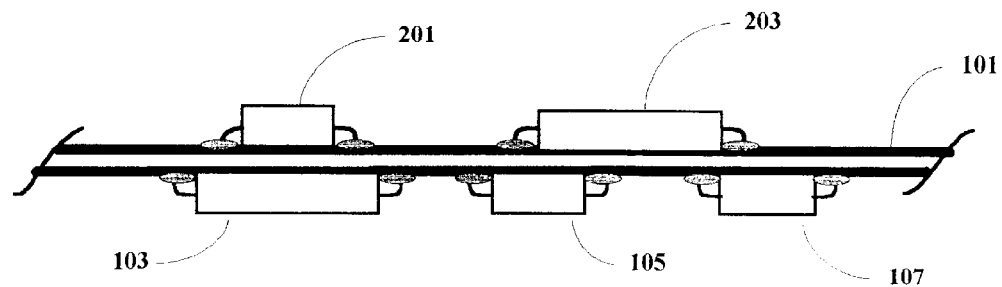
FIG. 2 is an illustration showing electronic components mounted on both sides of a circuit board.

In FIG. 2, the circuit board 101 is shown as the board is oriented during a second pass through a soldering oven. As illustrated, the components mounted during the first pass shown in FIG. 1 are now on the bottom side of the board 101 as other components, such as components 201 and 203 are attached to the top side of the board.

Figure 3:
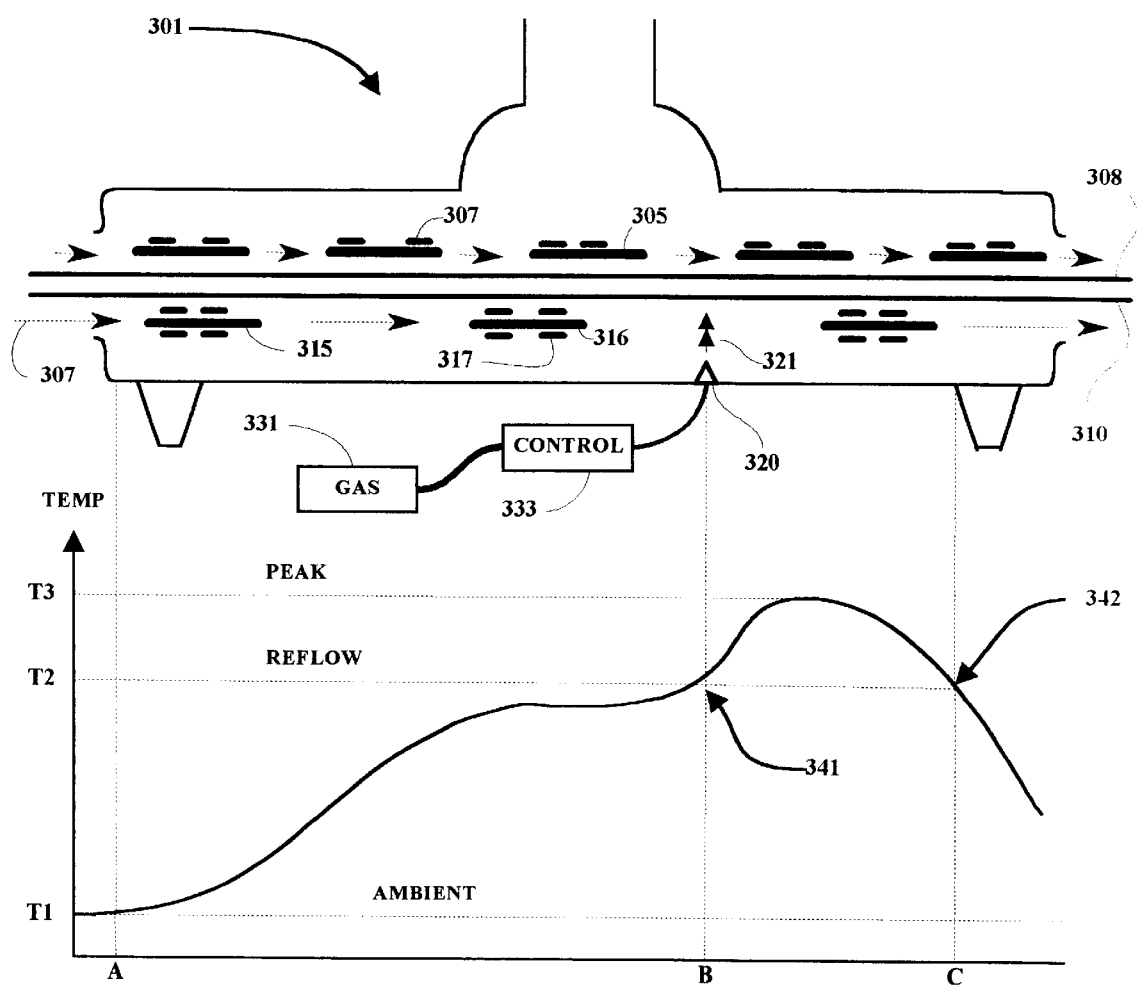
FIG. 3 is an illustration of an exemplary double-sided double pass card assembly operation utilizing the present invention.

The soldering oven 301 and the solder flow process is schematically illustrated in more detail in FIG. 3. In FIG. 3, the components are illustrated apart from the boards to which the components are mounted in order to illustrate more clearly the principles of operation. As shown, a plurality of boards, such as board 305, which contains a plurality of components, such as component 307, are passed through the soldering oven 301 on a first pass by a conveyor carrier 308. At the same time, boards that have already been through a first pass, such as boards 315 and 316, containing components, such as component 317, are being passed through the oven 301 on a second pass 307 by a conveyor carrier 310. During the second pass, components are attached to a second side of the circuit board so that when the process is completed, the circuit boards will emerge from the soldering oven having components attached to both side of the circuit boards.

During the second pass, the boards are inverted or flipped over such that the components mounted during the first pass are hanging from the bottom side of the circuit board while new components are mounted to the top side of the board. As hereinbefore noted, during the second pass through the oven, when the boards enter a reflow area in which the temperature is raised to a reflow point at which the solder on the boards begins to loosen or reflow, there is a tendency for the components mounted to the underside of the boards to fall off in which case the board will have to be reprocessed. The temperatures at various positions within the oven 301 are shown in the temperature chart which is also illustrated in FIG. 3. The boards enter the oven 301 at an ambient temperature T1 and the temperature begins to increase at position A. When the boards reach position B 341, the temperature in the oven 301 is at a reflow level of approximately 183° Centigrade. At this point, the solder on the circuit boards will begin to loosen or reflow. The board continues to travel through a peak temperature T3 in the oven 301 until the boards reach a point C 342 where the temperature again goes below the reflow temperature and the solder again hardens. It is between points B and C where the risk of component fall-off is greatest.

In accordance with the present invention, a gas is injected in the area of point B in the oven 301. The gas is injected through a knife-shaped nozzle 320 and applied as a sheet of gas 321 to the boards as the boards pass the point of injection in the oven 301. This point is in the area at which the solder begins to reflow. The gas is furnished from a supply 331 and controlled by a control device 333. The control device may be varied to adjust the amount of the gas applied and the shape and amount of the gas flow from the nozzle or injection device 320 may also be varied to provide desired or optimum results. In practice, the atmosphere of the solder oven 301 is typically nitrogen-rich in order to best accommodate the soldering process. The injected gas may be oxygen or even common outside atmosphere in order to alter the nitrogen environment of the oven and accomplish the forming the shielding layer around the solder beads as explained in connection with FIG. 4.

Figure 4:
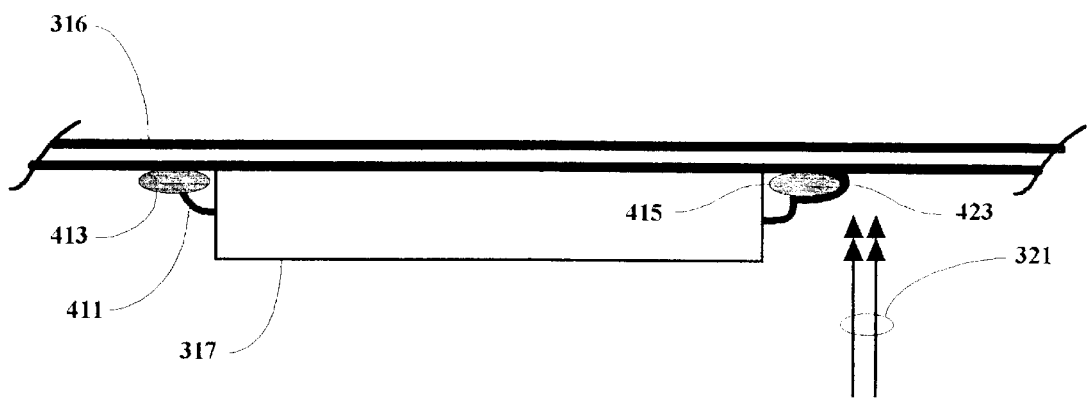
FIG. 4 is a detailed illustration showing a gas injection methodology in accordance with the present invention.

As shown in FIG. 4, a circuit board 316 is about to pass the point at which the injection device 320 is mounted in the solder oven 301. The board in the FIG. 4 example includes a component 317 which has component leads 411 soldered to the board 316 by means of solder beads such as beads 413 and 415. The gas 321 is injected into the oven 301 and onto a board 316 in a sheet-like flow in the present example, in order to be applied accurately to the component to terminal solder beads such as bead 415. When the gas 321, such as oxygen, is applied to the solder beads in the reflow temperature area of the solder oven, a protective coating or layer 423, such as tin-oxide, is formed which is effective to significantly increase surface tension between the component 317 and the board 316. This action in turn reduces the component drop-off rate and significantly reduces the need to re-work boards for component drop-off. Beneficial results may also be achieved to varying degrees by controlling the temperature of the injected gas.

The method and apparatus of the present invention has been described in connection with a preferred embodiment as disclosed herein. Although an embodiment of the present invention has been shown and described in detail herein, along with certain variants thereof, many other varied embodiments that incorporate the teachings of the invention may be easily constructed by those skilled in the art, and even included or integrated into a processor or CPU or other larger system integrated circuit or chip used to implement the disclosed methodology. Accordingly, the present invention is not intended to be limited to the specific form set forth herein, but on the contrary, it is intended to cover such alternatives, modifications, and equivalents, as can be reasonably included within the spirit and scope of the invention.

What is claimed is:

1. A soldering oven for use in connecting terminals of electronic components to first and second sides of a circuit board at solder joints located between said electronic component terminals and said circuit board, said oven comprising:

conveyor means arranged for passing said circuit board, on a first pass, through a soldering zone in said soldering oven for soldering a first group of said electronic components to said first side of said circuit board at solder joints located on said first side of said circuit board, said soldering zone being maintained above a solder flow temperature at which said solder joints liquefy, said conveyor means being further operable for passing said circuit board on a second pass through said soldering zone for soldering a second group of electronic components to said second side of said circuit board at solder joints located on said second side of said circuit board; and injection means arranged for directing a gas flow into said soldering zone at said first side of said circuit board during said second pass.

2. The soldering oven as set forth in claim 1 wherein said injection means is operable for directing said gas flow at said solder joints on said first side of said circuit board.

3. The soldering oven as set forth in claim 2 wherein said injection means comprises a gas injection device mounted in said soldering oven.

4. The soldering oven as set forth in claim 3 wherein said gas injection device is effective to direct said gas as a flattened stream of gas at said solder joints.

5. The soldering oven as set forth in claim 4 wherein said gas injection device is positioned in said soldering oven at an entry point to said soldering zone.

6. The soldering oven as set forth in claim 5 and further including:

a control device for controlling said gas flow such that said gas flow is directed at said solder joints only for a time period when said solder joints are in proximity to said gas injection device.

7. The soldering oven as set forth in claim 6 wherein said gas is oxygen.

8. The soldering oven as set forth in claim 4 wherein said gas injection device is operable to apply said gas to said solder joints when said solder joints are substantially at said solder flow temperature.

9. The soldering oven as set forth in claim 8 wherein said conveyor means is arranged to carry said circuit board in such a manner that said first side of said circuit board is facing downwardly in said soldering over during said second pass.

10. The soldering oven as set forth in claim 8 and further including:

a control device for controlling said gas flow such that said gas flow is directed at said solder joints only for a time period when said solder joints are in proximity to said gas injection device.

11. The soldering oven as set forth in claim 10 wherein said gas is oxygen.

* * * * *